(12) United States Patent
Jeon et al.

(10) Patent No.: US 7,791,951 B2
(45) Date of Patent: Sep. 7, 2010

(54) METHODS OF OPERATING NON-VOLATILE MEMORY DEVICE

(75) Inventors: Hee-Seog Jeon, Hwaseong-si (KR);
Seung-Beom Yoon, Suwon-si (KR);
Jeong-Uk Han, Suwon-si (KR);
Yong-Tae Kim, Yongin-si (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 0 days.

(21) Appl. No.: 12/364,570

(22) Filed: Feb. 3, 2009

(65) Prior Publication Data

US 2009/0141562 A1 Jun. 4, 2009

Related U.S. Application Data

(62) Division of application No. 11/323,355, filed on Dec. 30, 2005, now Pat. No. 7,492,002.

(30) Foreign Application Priority Data

Dec. 30, 2004 (KR) .............................. 2004-116845

(51) Int. Cl.
*G11C 11/34* (2006.01)

(52) U.S. Cl. .............................. 365/185.28; 365/185.18; 365/185.29; 257/316; 257/319; 257/320; 257/321

(58) Field of Classification Search ................. 257/316, 257/319, 320, 321; 365/189.18, 189.28, 365/189.29
See application file for complete search history.

(56) References Cited

U.S. PATENT DOCUMENTS

| | | | | | |
|---|---|---|---|---|---|
| 5,394,360 | A | * | 2/1995 | Fukumoto | .................... 257/315 |
| 5,422,504 | A | * | 6/1995 | Chang et al. | ........... 365/185.15 |
| 5,910,912 | A | * | 6/1999 | Hsu et al. | ............... 365/185.01 |
| 6,525,369 | B1 | * | 2/2003 | Wu | .............................. 257/315 |
| 6,562,673 | B2 | * | 5/2003 | Lin | .............................. 438/211 |
| 6,635,533 | B1 | * | 10/2003 | Chang et al. | ................. 438/259 |
| 6,787,418 | B2 | * | 9/2004 | Chu et al. | .................... 438/259 |
| 6,876,031 | B1 | * | 4/2005 | Kao et al. | .................... 257/315 |
| 7,265,411 | B2 | * | 9/2007 | Kang | .......................... 257/317 |
| 7,315,056 | B2 | * | 1/2008 | Klinger et al. | ............... 257/315 |
| 2003/0198086 | A1 | * | 10/2003 | Shukuri | .................. 365/185.18 |

FOREIGN PATENT DOCUMENTS

| | | | | |
|---|---|---|---|---|
| JP | 01248670 | A | * | 10/1989 |
| JP | 2001085544 | A | * | 3/2001 |
| KR | 10-2002-0044702 | | * | 6/2002 |
| KR | 10-2002-0014275 | | * | 7/2008 |

* cited by examiner

*Primary Examiner*—Dang T Nguyen
*Assistant Examiner*—Alexander Sofocleous
(74) *Attorney, Agent, or Firm*—F. Chau & Associates, LLC

(57) ABSTRACT

A non-volatile memory device includes a floating gate formed on a substrate with a gate insulation layer interposed therebetween, a tunnel insulation layer formed on the floating gate, a select gate electrode inducing charge introduction through the gate insulation layer, and a control gate electrode inducing charge tunneling occurring through the tunnel insulation layer. The select gate electrode is insulated from the control gate electrode. According to the non-volatile memory device, a select gate electrode and a control gate electrode are formed on a floating gate, and thus a voltage is applied to the respective gate electrodes to write and erase data.

13 Claims, 14 Drawing Sheets

METHODS OF OPERATING NON-VOLATILE MEMORY DEVICE

CROSS-REFERENCE TO RELATED APPLICATION

This application is a divisional of U.S. patent application Ser. No. 11/323,355, now U.S. Pat. No. 7,492,002, filed on Dec. 30, 2005, which in turn claims priority under 35 U.S.C. § 119 to Korean Patent Application No. 2004-116845, filed on Dec. 30, 2004, now U.S. Pat. No. 7,492,002, in the Korean Intellectual Property Office, the disclosures of which are incorporated by reference herein in their entireties.

BACKGROUND. OF THE INVENTION

1. Field of the Invention

The present invention relates to a semiconductor device and to methods of operating and fabricating the same. More specifically, the present invention is directed to a non-volatile memory device and to methods of operating and fabricating the same.

2. Description of Related Art

Non-volatile memory devices store data in an electrically insulated manner. Typically, non-volatile memory devices include stack-gate memory devices, split-gate memory devices, and Electrically Erasable Programmable Read Only Memory (EEPROMs) devices.

FIG. 1 is an equivalent circuit diagram of a cell array of a conventional split-gate memory device, and FIG. 2 is a cross-sectional view of a conventional split-gate memory device.

FIG. 1 and FIG. 2, illustrate a cell array of a conventional split-gate memory device which adopts an NOR type cell array to randomly access memory cells. Memory cells are arranged in row and column directions to share a source region 22 or a drain region 24 with adjacent memory cells. Each of the memory cells includes a channel region defined between a source region 22 and a drain region 24, a gate insulation layer 12 formed on the channel region, a floating gate 14 formed on the gate insulation layer 12, a control gate electrode 16 formed on the gate insulation layer 12 and the floating gate 14, and a tunnel insulation layer 20 interposed between the control gate electrode 16 and the floating gate 14. An insulation layer having an elliptical section is formed on the floating gate 14, so that a tip is formed to enhance a tunneling efficiency.

As illustrated in FIG. 1, control gate electrodes 16 of memory cells arranged in a column direction are connected to constitute a wordline WLn, and source regions are connected to constitute a common source line CSL. A drain region of memory cells arranged in a column direction is connected to a bitline BLn. A NOR-type cell array of a stack-gate memory device has an over-erase problem, while a NOR-type cell array of a split-gate memory device does not have an over-erase problem because the control gate electrode formed on the gate insulation layer corresponds to a gate electrode of a select transistor.

In a split-gate memory device, a control gate voltage is applied to a control gate electrode 16 for forming a channel below the control gate electrode 16 and a program voltage of about 10 volts is applied to a source region 22 to inject charges into a floating gate 14 through a gate insulation layer 12. The program voltage is coupled to the floating gate 14 by an overlap capacitance of a source region 22 and the floating gate 14. Thus, a high program voltage is required for inducing a sufficient vertical field to a channel region. For this reason, the source region 22 must be configured to have a high junction breakdown voltage.

Unlike a split-gate memory device, an EEPROM is not required for a junction structure for applying a high junction breakdown voltage because a relatively lower voltage is applied to a source region or a drain region.

FIG. 3 is an equivalent circuit diagram of a cell array of a conventional EEPROM, and FIG. 4 is a cross-sectional view of the conventional EEPROM.

Referring to FIG. 3 and FIG. 4, unlike a split-gate memory device, an EEPROM has a configuration where a select gate electrode and a control gate electrode are isolated from each other. Memory cells of the EEPROM are arranged in row and column directions and share a source region 68 and a drain region 66 with adjacent memory cells. Each of the memory cells includes a channel region defined between a source region 68 and a drain region 66, a tunnel insulation layer 52 and a gate insulation layer 54 which are formed on the channel region, a floating gate 56 formed on the tunnel insulation layer 52 and the gate insulation layer 54, and a control gate electrode 60 formed on the gate insulation layer 54 to be spaced apart from the floating gate electrode 56. A select gate electrode 58 is formed on the floating gate 56 with an intergate dielectric 62 interposed therebetween. A floating diffusion layer 64 is formed in a substrate between the floating gate 56 and the control gate electrode 60 to extend to the bottom of the tunnel insulation layer 52.

As illustrated in FIG. 3, select gate electrodes of memory cells arranged in a column direction are connected to constitute a sensing line SL. Control gate electrodes of memory cells arranged in a column direction are connected to constitute a wordline WL, and source regions in a column direction connected to a common source line CSL. A sensing line SL is divided into a plurality of cell units to selectively erase memory cells connected to a wordline WL. Since an EEPROM requires a wider cell area than a split-gate memory device, there is a limit to an integration density of the EEPROM.

As previously stated, a split-gate memory device has a control gate electrode acting as a gate electrode of a select transistor. Thus, the split-gate memory device is advantageous in high integration density. However, with split-gate memory devices, a high breakdown voltage is required because a program operation is performed by source junction coupling of a low coupling ratio. Meanwhile, an EEPROM device, in which a program operation is performed by gate coupling, does not require a high junction breakdown voltage. Nevertheless, EEPROM devices have certain disadvantages such as a large cell area and a limited integration density because a select gate electrode and a control gate electrode are spaced apart from each other.

SUMMARY OF THE INVENTION

Exemplary embodiments of the present invention are directed to a non-volatile memory device which overcomes disadvantages of split-gate memory devices and EEPROMs and a method of operating and fabricating the non-volatile memory device.

Further, exemplary embodiments of the present invention are directed to a non-volatile memory device in which a unit cell area is small and a high voltage is not applied to a source region or a drain region.

In an exemplary embodiment of the present invention, there is provided an non-volatile memory device including a floating gate formed on a substrate with a gate insulation layer interposed therebetween, a tunnel insulation layer formed on the floating gate, a select gate electrode inducing charge introduction through the gate insulation layer, and a control gate electrode inducing charge tunneling occurring through the tunnel insulation layer.

In another exemplary embodiment of the present invention, there is provided a non-volatile memory device including a source region and a drain region defining a channel region in a substrate, a gate insulation layer formed on the channel region, a floating gate formed over the gate insulation layer, a select gate electrode formed on the gate insulation layer and the floating gate, a control gate electrode on a sidewall of the floating gate and the gate insulation layer to be opposite to the select gate electrode. The non-volatile memory device further includes an intergate dielectric interposed between the select gate electrode and the floating gate, and a tunnel insulation layer interposed between the control gate electrode and the floating gate.

In another exemplary embodiment of the present invention, there is provided a non-volatile memory device including a device isolation layer formed to define a plurality of active regions on a semiconductor substrate; a gate insulation layer formed on the respective active regions, a floating gate formed on the respective gate insulation layers, a sensing line formed on the gate insulation layer and the floating gate to cross over the active regions and a wordline formed on a sidewall of the floating gate and the gate insulation layer to cross over the active regions. The wordline being opposite to the sensing line. The non-volatile memory device further includes an intergate dielectric interposed between the sensing line and the floating gate, an intergate dielectric interposed between the sensing line and the floating gate, and a tunnel insulation layer interposed between the wordline and the floating gate.

In another exemplary embodiment of the present invention, there is provided a method for operating a non-volatile memory device including a source region and a drain region defining a channel region, a gate insulation layer on the channel region, a floating gate on the gate insulation layer, a select gate electrode on the gate insulation layer and the floating gate, a control gate electrode on a sidewall of the floating gate and the gate insulation layer to be opposite to the select gate electrode, an intergate dielectric interposed between the select gate electrode and the floating gate, and a tunnel insulation layer interposed between the control gate electrode and the floating gate. The method includes a write step in which charges are injected to the floating gate through the gate insulation layer, a read step in which fluctuation of a threshold voltage of channel region below the floating gate, which is caused by charges stored in the floating gate, is sensed, and an erase step in which tunneling of the charges stored in the floating gate is induced through the tunnel insulation layer.

In another exemplary embodiment of the present invention, there is provided a method for fabricating a semiconductor device. The method includes defining an active region on a semiconductor substrate, forming a floating gate conductive layer on an entire surface of the substrate with a gate insulation layer interposed between the active region and the floating gate conductive layer, forming a top select gate electrode on the floating gate conductive layer to cross over the active region; patterning the floating gate conductive layer to form a floating gate on the active region, forming a tunnel insulation layer on a sidewall of the floating gate, and forming a sidewall select gate electrode and a control gate electrode on a tunnel insulation layer and a gate insulation layer disposed at opposite sides adjacent to the floating gate. The sidewall select gate electrode and the control gate electrode being opposite to each other.

BRIEF DESCRIPTION OF THE DRAWINGS

FIG. 9A through FIG. 17A are top plan views for explaining a method for fabricating a non-volatile memory device according to an exemplary embodiment of the present invention.

FIG. 9B through FIG. 17B are cross-sectional views taken along lines II-II' of FIG. 9A through FIG. 17A, respectively.

FIG. 9C through FIG. 17C are cross-sectional views taken along lines III-III' of FIG. 9A through FIG. 17A, respectively.

DETAILED DESCRIPTION OF THE PREFERRED EMBODIMENTS

Figure 1:
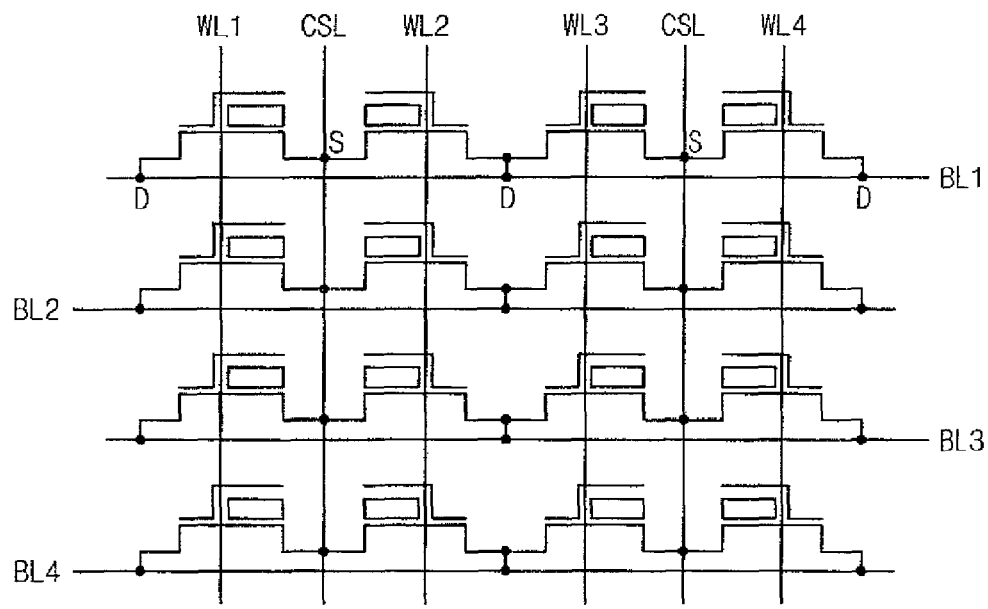
FIG. 1 is an equivalent circuit diagram of a cell array of a conventional split-gate memory device.
Figure 2:
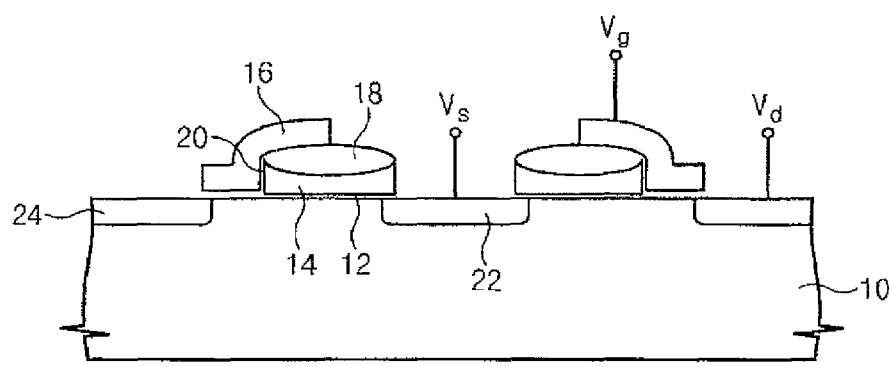
FIG. 2 is a cross-sectional view of a conventional split-gate memory device.
Figure 3:
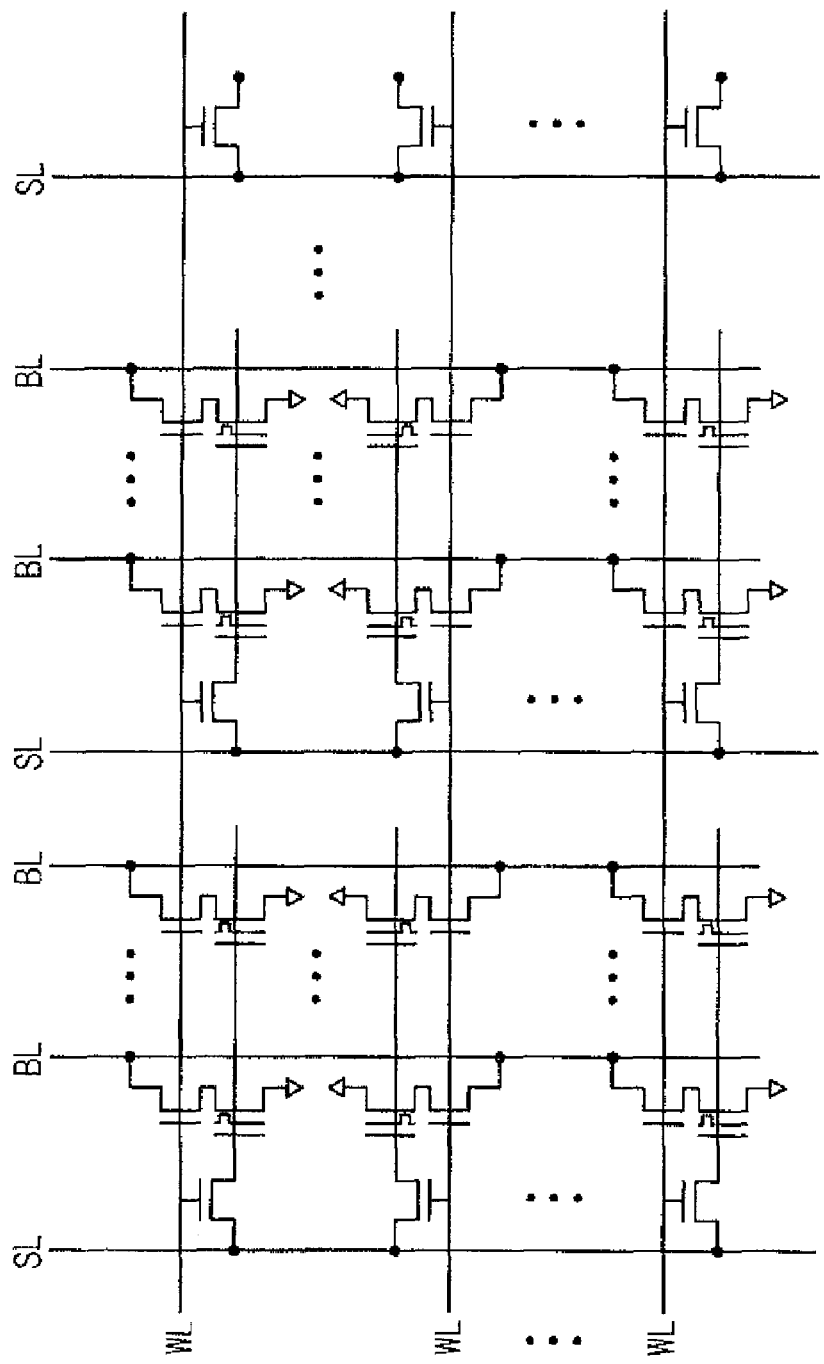
FIG. 3 is an equivalent circuit diagram of a cell array of a conventional EEPROM.
Figure 4:
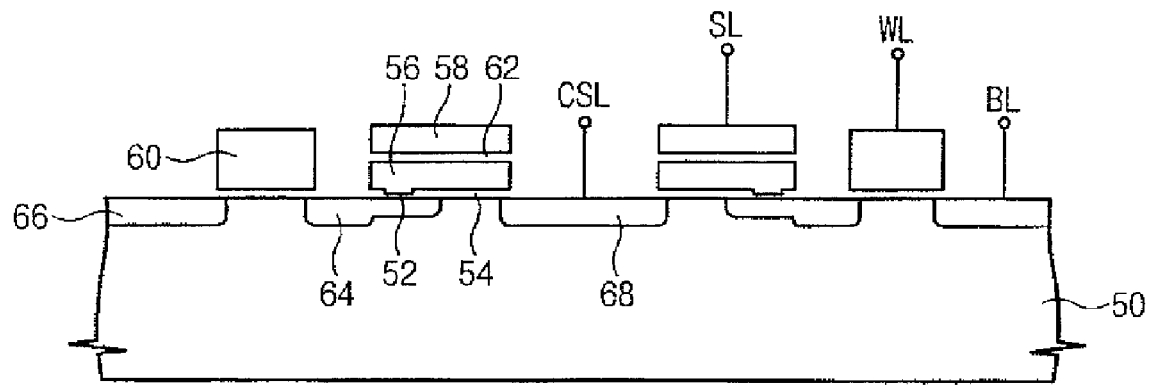
FIG. 4 is a cross-sectional view of the conventional EEPROM.

The exemplary embodiments of the present invention will now be described more fully hereinafter with reference to the accompanying drawings, in which preferred embodiments of the invention are shown. The invention may, however, be embodied in different forms and should not be construed as limited to the embodiments set forth herein. In the drawings, the height of layers and regions are exaggerated for clarity. It will also be understood that when a layer is referred to as being "on" another layer or substrate, it can be directly on the other layer or substrate, or intervening layers may also be present. Like numbers refer to like elements throughout.

Figure 5:
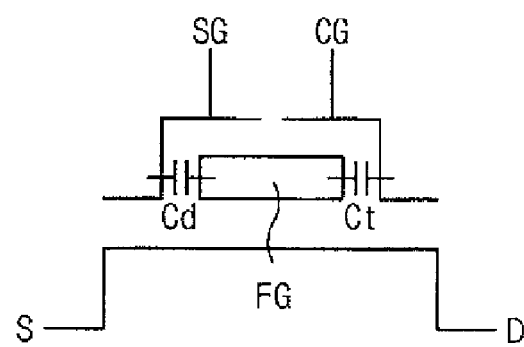
FIG. 5 is a symbolic diagram of a non-volatile memory device according to an exemplary embodiment of the present invention.

FIG. 5 is a symbolic diagram of a unit cell of a non-volatile memory device according to an exemplary embodiment of the present invention. The non-volatile memory device includes a source region S and a drain region D defining an a channel region, a floating gate FG disposed over the channel region, a select gate electrode SC and a control gate electrode CG disposed on the floating gate FG. The control gate electrode CG and the select gate electrode SG are oppositely insulated from each other. A gate insulation layer is interposed between the floating gate FG and the channel region, and a tunnel insulation layer is interposed between the control gate electrode CG and the floating gate FG. Further, an intergate dielectric is interposed between the select gate electrode SG and the floating gate FG. The select gate electrode SC couples a program voltage to the floating gate FG, allowing charges to be injected into the floating gate FG through a gate insulation layer. An erase voltage is applied to the control gate electrode CG to induce tunneling of charges through the tunnel insulation layer. A capacitance $C_d$ of a capacitor including the select gate electrode SG, the floating gate FG, and the intergate dielectric is made higher than a capacitance $C_t$ of a capacitor including the control gate electrode CC, the floating gate FG, and the tunnel insulation layer, enhancing program and erase efficiencies. For example, the intergate dielectric interposed between the select gate electrode SG and the floating gate FG may be formed to have a larger area than the tunnel insulation layer interposed between the control gate electrode CG and the floating gate FG or the intergate dielectric may include a material having a higher dielectric constant than the tunnel insulation layer.

In the non-volatile memory device, data is stored in the floating gate FG through the gate insulation layer by hot carrier injection. The stored data is erased by Fowler-Nordheim tunneling (FN tunneling). A program voltage applied to the select gate electrode SG is coupled to the floating gate FG simultaneously to formation of a channel at a channel region formed therebelow. Hot carriers generated below the floating gate FG around a boundary portion of the channel and the select gate electrode SG are injected to the floating gate FG by a vertical field crossing the gate insulation layer. If an erase voltage is applied to the control gate electrode CG, charges are tunneled through the tunnel insulation layer by FN tunneling to erase the data stored in the floating gate FG.

A program voltage is applied to a select gate electrode SG to be coupled to a floating gate FG, and a turn-on voltage is applied to a control gate electrode CG to invert a channel region below a control gate electrode. The turn-on voltage applied to the control gate electrode CG is higher than a threshold voltage at which the channel region is inverted. A ground voltage is applied to a drain region D and a constant voltage is applied to a source region S, so that hot carriers generated from a channel region are led to a vertical field by a voltage coupled to the floating gate to be stored in the floating gate over a potential wall. If a typical Negative-Channel Metal Oxide Semiconductor (NMOS) transistor structure is adopted, electrons accelerated toward the source region are to be stored in a floating gate over a potential wall of a gate insulation layer.

Charges (generally, electrons) stored in the floating gate FG fluctuate a threshold voltage at which a channel region below the floating gate FG is inverted. A programmed threshold voltage that is a threshold voltage laid in a state where electrons are accumulated in the floating gate FG is higher than an erased threshold voltage that is a threshold voltage laid in a state where electrons are not accumulated therein. In this regard, a voltage between a programmed threshold voltage and an erased threshold voltage is applied to read data stored in a floating gate. For example, if a read voltage is applied to the select gate electrode SG and/or the control gate electrode CG, a channel region below the select gate electrode and the control gate electrode is inverted and a read voltage is coupled to the floating gate. Inversion of the channel region below the floating gate is determined depending on whether electrons are stored in the floating gate.

A ground voltage is applied to the source region S, the drain region D, and the select gate electrode SG and an erase voltage is applied to the control gate electrode CG, erasing the data stored in the floating gate FG. The erase voltage applied to the control gate CG establishes a high electric field at the tunnel insulation layer to lead to FN tunneling of electrons stored in the floating gate FG or holes supplied to the control gate electrode.

A table [TABLE 1] shows an operating voltage of the non-volatile memory device according to an exemplary embodiment of the present invention. In the table [TABLE 1], Vsl, Vwl, Vs, and Vbl denote a voltage applied to a select gate electrode, a voltage applied to a control gate, a voltage applied to a source region, and a voltage applied to a drain region, respectively.

TABLE 1

|  | Vsl | Vwl | Vs | Vbl |
| --- | --- | --- | --- | --- |
| program | 8~10 V | 2 V | 3.3 V | 0 V |
| read | 1 V | 1.5~2.0 V | 0 V | 1 V |
| erase | 0 V | 10~12 V | 0 V | 0 V |

The table [TABLE 1] is merely based on an exemplary embodiment of an operation voltage of the non-volatile memory device according to the present invention, and thus applied voltages may vary with structural characteristics of a device.

Figure 6:
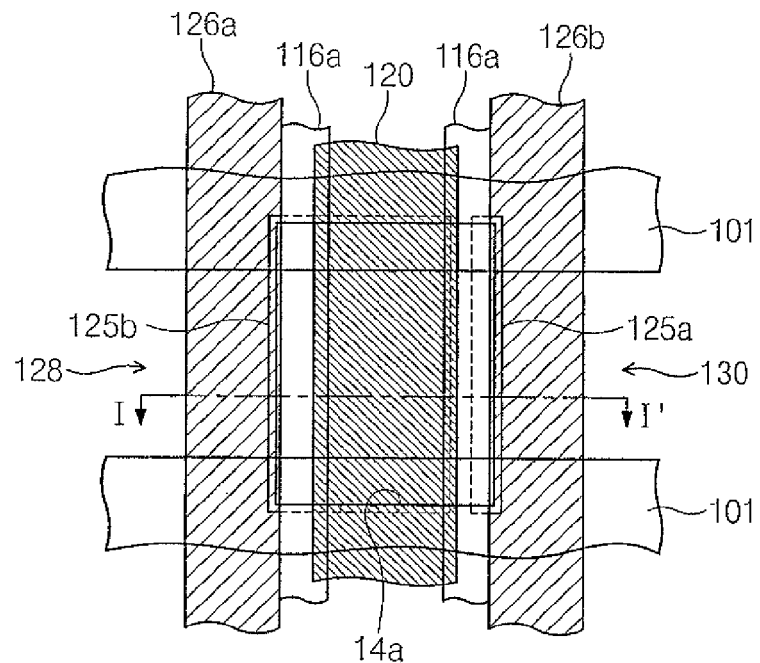
FIG. 6 is a top plan view of a non-volatile memory device according to an exemplary embodiment of the present invention.
Figure 7:
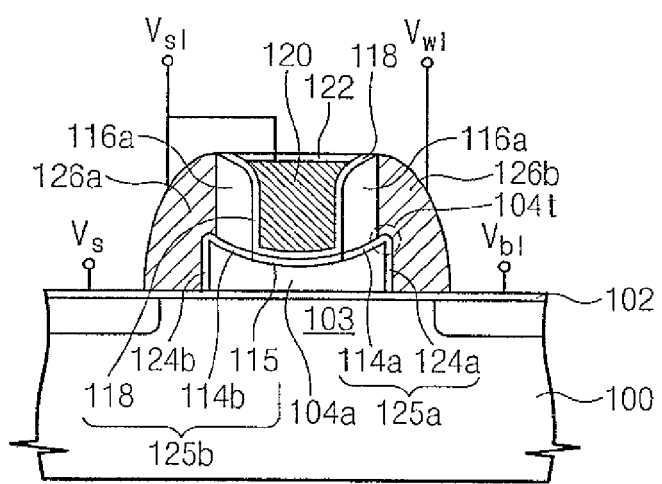
FIG. 7 is a cross-sectional view taken along a line I-I' of FIG. 6.

FIG. 6 is a top plan view of a unit cell of a non-volatile memory device according to an embodiment of the present invention, and FIG. 7 is a cross-sectional view taken along a line I-I' of FIG. 6.

Referring to FIG. 6 and FIG. 7, the non-volatile memory device includes a source region 128 and a drain region 130 defining a channel region 103 in a semiconductor substrate 100 and a gate structure. The gate structure includes a floating gate formed on a gate insulation layer, a select gate electrode on the floating gate with an intergate dielectric interposed therebetween, and a control gate electrode formed on the floating gate with a tunnel insulation layer interposed therebetween. A capacitance $C_d$ of a capacitor including the control gate electrode, the floating gate, and the tunnel insulation layer is preferably higher than a capacitance $C_t$ of a capacitor including the control gate electrode, the floating gate, and the tunnel insulation layer, as previously described in FIG. 5. For this reason, an opposite area of the select gate electrode and the floating gage is larger than that of the control gate electrode and the floating gate. Alternatively, the intergate dielectric includes a material having a higher dielectric constant than the tunnel insulation layer.

Specifically, a gate insulation layer 102 is formed on the channel region 103. The floating gate 104a is formed on the gate insulation layer 102. The select gate electrode includes a sidewall select gate electrode 126a formed on one sidewall of the floating gate 104a and on the gate insulation layer and a top select gate electrode 120 formed over the floating gate 104a. The control gate electrode 126b is formed on the other sidewall of the floating gate 104a and the gate insulation layer 102. The sidewall select gate electrode 126a and the control gate electrode 126b are symmetrical with each other. A spacer insulation layer 116a is interposed between the top select gate electrode 120 and the sidewall select gate electrode 126a and between the top select gate electrode 120 and the control gate electrode 126b. The spacer insulation pattern 116a insulates the top select gate electrode 120 from the sidewall select gate electrode 126a and the control gate electrode 126b. However, the top select gate electrode 120 and the sidewall select gate electrode 126a are commonly connected to an interconnection, so that an equivalent bias voltage Vsl may be applied thereto.

Insulation layers 114a and 124a, interposed between the control gate electrode 126b and the floating gate 104a constitute a tunnel insulation layer 125a. Moreover, insulation layers 114b, 115, 118, and 124b interposed between the select gate electrode 126a and 120b and the floating gate 104a constitute an intergate dielectric 125b. The insulation layer formed on the spacer insulation pattern 116a and the floating gate 104a may be a dielectric layer including a material having a higher dielectric constant than the tunnel insulation layer 125a. For example, if the tunnel insulation layer 125a is made of silicon oxide, the dielectric layer 118 may be made of at least one of insulative metal oxide and silicon nitride having a higher dielectric constant than silicon oxide. As illustrated, since the non-volatile memory device has a symmetric structure, an insulation layer interposed between the sidewall select gate electrode 126a and the floating gate 104a may be identical to the insulation layer constituting the tunnel insulation layer 125a.

The floating gate 104a may have a tip 104t disposed toward the control gate electrode 126b. Thus, an electric field is concentrated around the tip 104t at an erase operation, so that charge tunneling based on FN tunneling has a high probability around the tip 104t of the tunnel insulation layer. A low capacitance $C_t$ between the control gate electrode 126b and the floating gate 104a may increase a difference of voltages applied to the tunnel insulation layer 125a to induce FN tunneling at a relatively lower voltage. Since a capacitance between the floating gate 104a and the channel region 103 as well as a capacitance between the floating gate 104a and the select gate electrode increases a ratio of voltages coupled between the control gate electrode 126b and the floating gate 104a, an erase efficiency may be enhanced.

As illustrated, the memory device may have a symmetrical section structure. Thus, the floating gate 104a may have a tip disposed toward the sidewall select gate electrode 126a. However, although a high voltage is applied to a select gate electrode including a sidewall select gate electrode 126a and a top select gate electrode 120 at a program operation, a high capacitance $C_d$ between the select gate electrode and the floating gate decreases a difference of voltages applied to the intergate dielectric 125b. Therefore, a probability of FN tunneling occurring through an intergate dielectric is low and a relatively lower voltage is required. For this reason, FN tunneling does not occur substantially around a tip disposed toward the sidewall select gate electrode 126a.

A channel region 103 of the memory device may be divided into a region below the sidewall select gate electrode 126a, a region below the floating gate 104a, and a region below the control gate electrode 126b. As previously stated, the divided channel region 103 is selectively turned on or off at program, read, and erase operations to store, read, and erase data.

Figure 8:
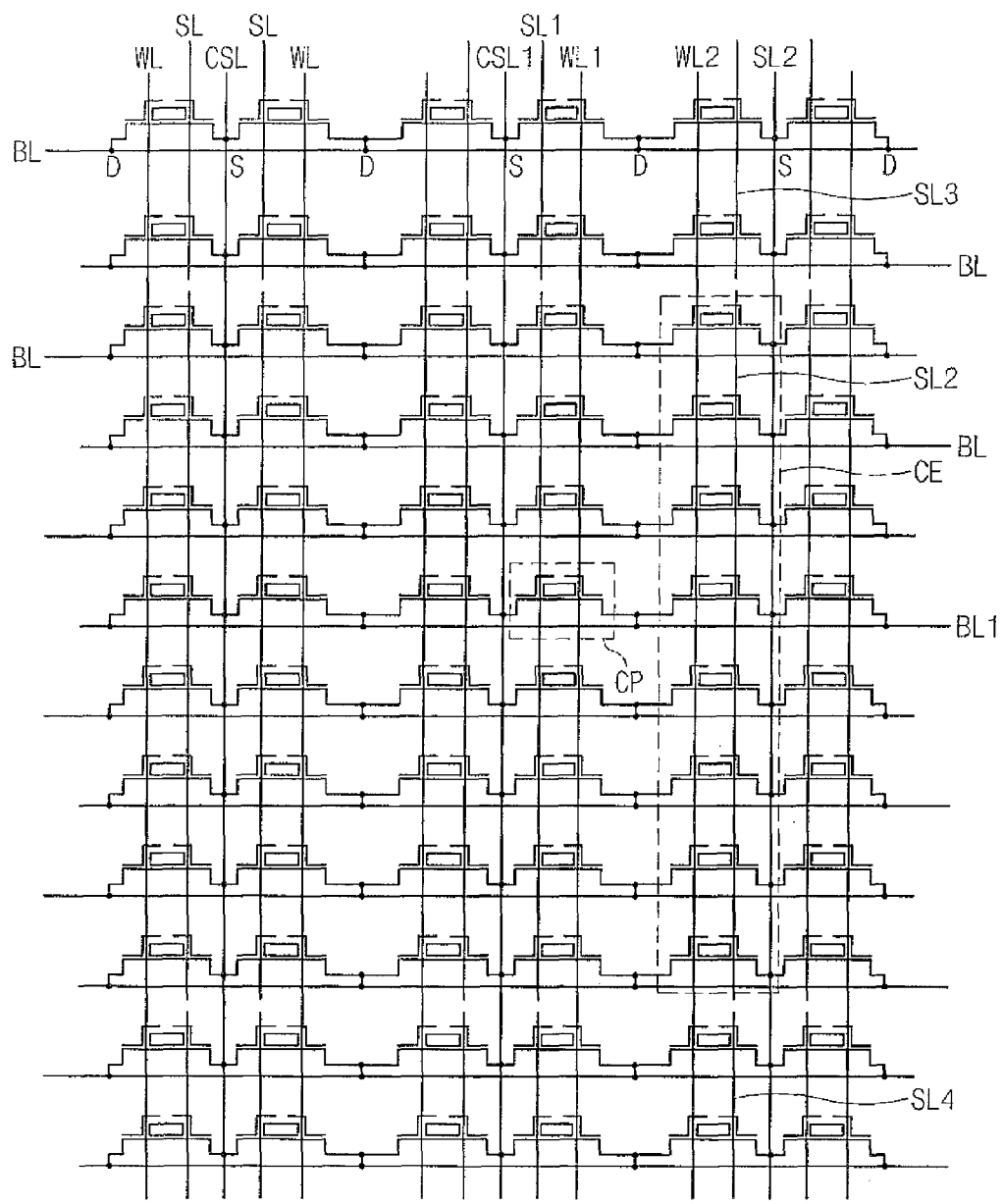
FIG. 8 is an equivalent circuit diagram of a cell array of a non-volatile memory device according to an exemplary embodiment of the present invention.

FIG. 8 is an equivalent circuit diagram of an array of a non-volatile memory device according to an exemplary embodiment of the present invention. The non-volatile memory device includes a plurality of unit memory cells arranged in row and column directions. The memory cells shares a source region S and a drain region D with adjacent memory cells, respectively. Therefore, adjacent memory cells are symmetrically disposed in a row direction. The unit memory cells include a floating gate on a channel region defined between a source region S and a drain region D and a select gate electrode and a control gate electrode which are oppositely formed on the floating gate. Source regions S of the unit memory cells are connected in a column direction to constitute a common source region CSL. A select gate electrode and control gate electrodes of the unit memory cells are connected in a column direction to constitute a sensing line SL and a wordline WL, respectively. The sensing line SL is divided at the respective memory cells to be opposite to one wordline WL and a plurality of sensing lines SL. Drain regions disposed in a row direction are connected to a bitline.

The above-described cell array configuration allows for the selective erasure of memory cells sharing a sensing line SL. The memory device including the cell array is operated by selecting each unit cell to write and read data and by selecting predetermined unit cells to erase the data.

A constant voltage Vcc, a ground voltage GND, a write voltage, and a turn-on voltage are applied to a common source line CSL1, a select bitline BL1, a select sensing line SL1, and a select wordline WL1 which are connected to a selected memory cell CP, respectively. A ground voltage is applied to an unselect common source line, an unselect bitline, an unselect sensing line, and an unselect wordline, respectively. By dong so, data is stored in a select memory cell.

Stored data may be read by selecting a specific memory cell. A ground voltage, a read voltage, a turn-on voltage, and a verify voltage are applied to a select common source line CSL1, a select bitline BL1, a select sensing line SL1, and a select wordline WL1 which are connected to a memory cell CP selected in a read operation, respectively. A ground voltage is applied to an unselect common source line, an unselect bitline, an unselect sensing line, and an unselect wordline which are not connected to the selected memory cell CP, respectively. By doing so, data may be read.

Stored data may be erased by selecting predetermined memory cells CE. Memory cells selected in an erase operation may be memory cells sharing a selected wordline. Further, a sensing line is divided at respective predetermined memory cells to select memory cells sharing a sensing line at an erase operation in the case where a plurality of sensing lines are opposite to one wordline.

A ground voltage is applied to a common source line CSL2, a select bitline BL, and a select sensing line SL2 which are connected to selected memory cells CE, and an erase voltage is applied to a select wordline WL2. Further, a ground voltage is applied to an unselect common source line, an unselect bitline, unselect sensing lines SL3 and SL4, and an unselect wordline which are not connected to selected memory cells. By doing so, selected memory cells may be erased at a time.

On the other hand, memory cells sharing a wordline, not a sensing line, with selected memory cells may inhibit an erase operation by applying an erase inhibit voltage. In other words, although an erase voltage is applied to a select wordline, if a positive voltage, i.e., an erase inhibit voltage is applied to an unselect sensing line opposite to a wordline to which an erase voltage is applied, a voltage level of a floating gate rises to drop a voltage applied between a wordline and a floating gate. Thus, an electric field required for an erase operation is not established at the memory cell.

A table [TABLE 2] shows an operating voltage of a cell array according to an exemplary embodiment of the invention. In the table [TABLE 2], Vs11, Vs12, Vw11, Vw12, Vs1, Vs2, Vb11, and Vb12 denote a voltage applied to a select sensing line, a voltage applied to an unselect sensing line, a voltage applied to a select wordline, a voltage applied to an unselect wordline, a voltage applied to a select source line, a voltage applied to an unselect source line, a voltage applied to a select bitline, and a voltage applied to an unselect bitline, respectively.

TABLE 2

|  | Vsl1 | Vsl2 | Vwl1 | Vwl2 | Vs1 | Vs2 | Vbl1 | Vbl2 |
|---|---|---|---|---|---|---|---|---|
| program | 8~10 V | 0 V | 2 V | 0 V | 3.3 V | 0 V | 0 V | 0 V |
| read | 1 V | 0 V | 1.5~2.0 V | 0 V | 0 V | 0 V | 1 V | 0 V |
| erase | 0 V | 3.3 V | 10-12 V | 0 V | 0 V | 0 V | 0 V | 0 V |

The table [TABLE 2] is merely based on an exemplary embodiment of an operation voltage of the cell array according to the present invention, and thus applied voltages may vary with structural characteristics of a device.

An unselect wordline voltage Vsl2 applied in an erase operation is a constant voltage Vcc but may be replaced with an erase inhibit voltage.

FIG. 9A through FIG. 17A are top plan views for explaining a method for fabricating a non-volatile memory device according to an exemplary embodiment of the present invention. FIG. 9B through FIG. 17B are cross-sectional views taken along lines II-II' of FIG. 9A through FIG. 17A, respectively. FIG. 9C through FIG. 17C are cross-sectional views taken along lines III-III' of FIG. 9A through FIG. 17A, respectively.

Figure 9A:
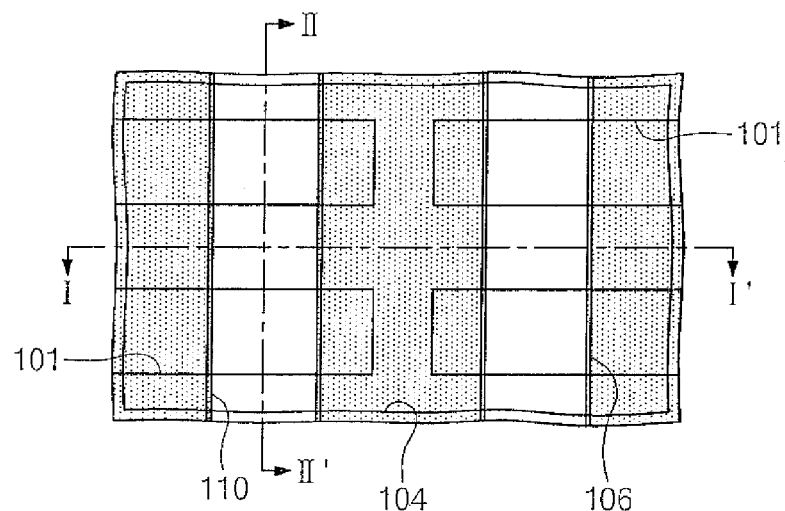
Figure 9B:
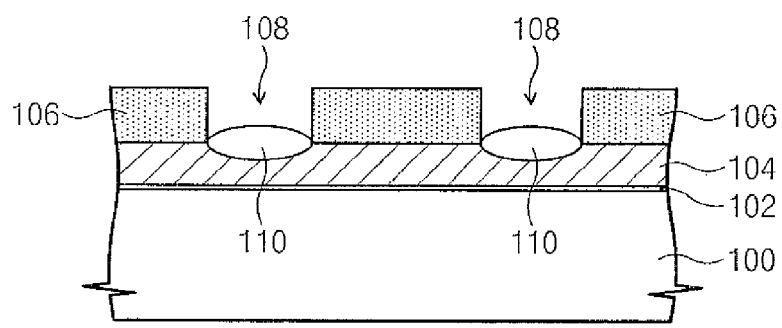
Figure 9C:
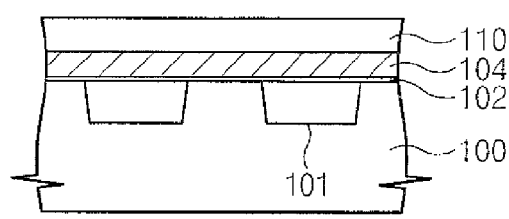

Referring to FIG. 9A, FIG. 9B, and FIG. 9C, a device isolation layer 101 is formed on a semiconductor substrate 100 to define a plurality of active regions. A gate insulation layer 102 is formed on the active region, and a floating gate conductive layer 104 is formed on an entire surface of the substrate 100. The floating gate conductive layer 104 may be made of polysilicon and become conductive by implanting impurities thereinto. A hard mask pattern 106 is formed on the floating gate conductive layer 104. The hard mask pattern 106 has a groove 108 crossing over the active region and the device isolation layer 101 and exposing the floating gate conductive layer 104. Using the hard mask pattern 106 as an oxidation barrier layer, a sacrificial oxide pattern 110 is formed to thermally oxidize the floating gate conductive layer 104. The sacrificial oxide pattern 110 has an elliptical section.

Figure 10A:
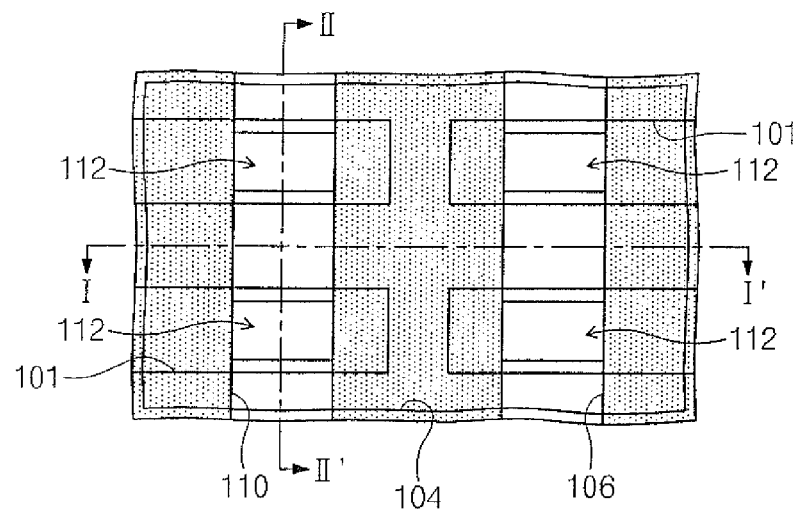
Figure 10B:
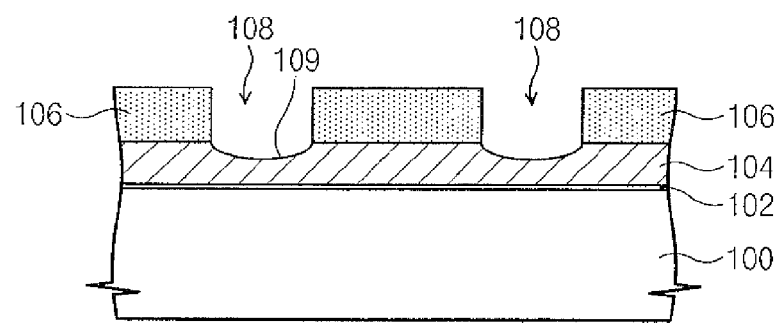
Figure 10C:
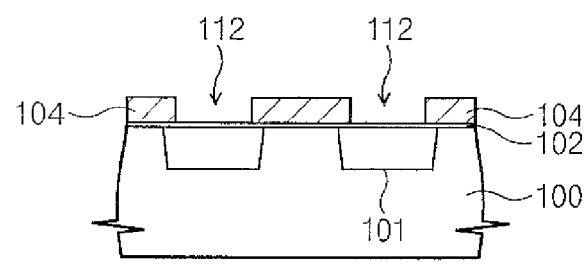

Referring to FIG. 10A, FIG. 10B, and FIG. 10, the sacrificial oxide pattern 110 is removed to expose the floating gate conductive layer 104. A recess region 109 is formed at a portion where the sacrificial oxide pattern 110 is removed. A floating gate conductive layer 104 exposed in the groove 108 is removed to form a removal region 112 where the device isolation layer 101 or the gate insulation layer formed on the device isolation layer is removed. For example, after forming a mask with an opening exposing a floating gate conductive layer 104 over the device isolation layer 101, the floating gate conductive layer 104 disposed thereover may be removed using the mask as an etch mask.

Figure 11A:
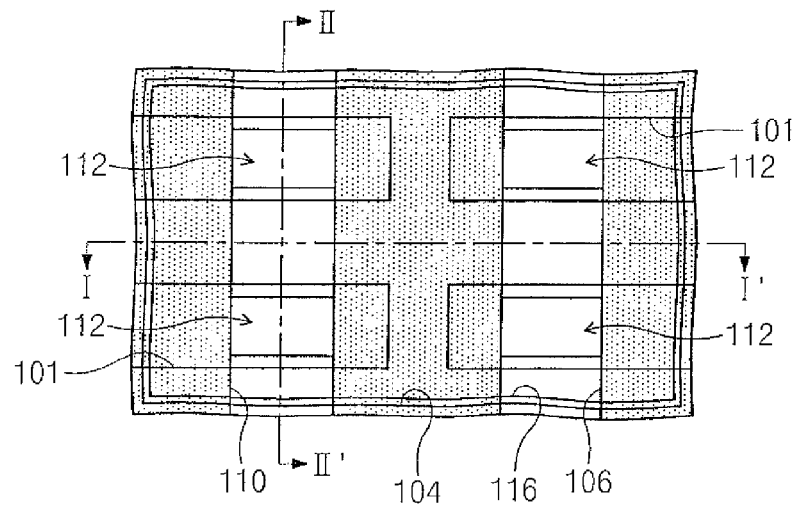
Figure 11B:
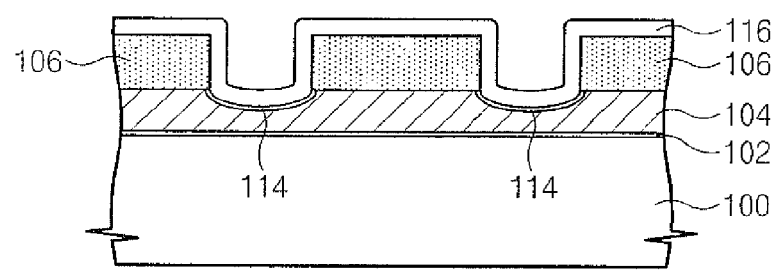
Figure 11C:
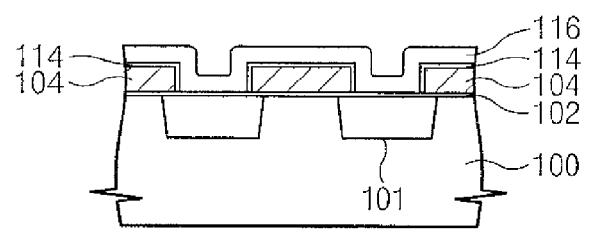

Referring to FIG. 11A, FIG. 11B, and FIG. 11C, a thermal oxidation process is carried out to form a thermal oxide layer 114 on a surface of the floating gate conductive layer 104 exposed in the groove 108. During this process, surface defects of the floating gate conductive layer may be cured. A spacer insulation layer 116 is formed on the entire surface of the substrate to be covered in the groove 108. The spacer insulation layer 116 is made of a material having an etch selectivity with respect to the hard mask pattern 106.

Figure 12A:
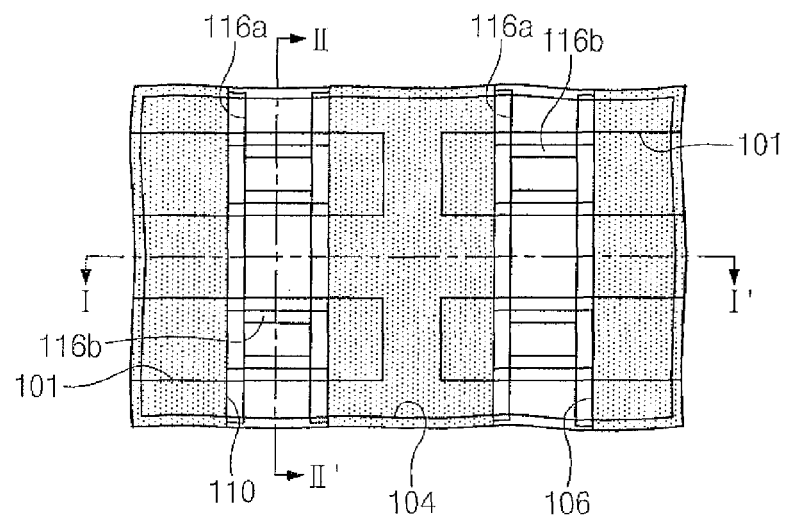
Figure 12B:
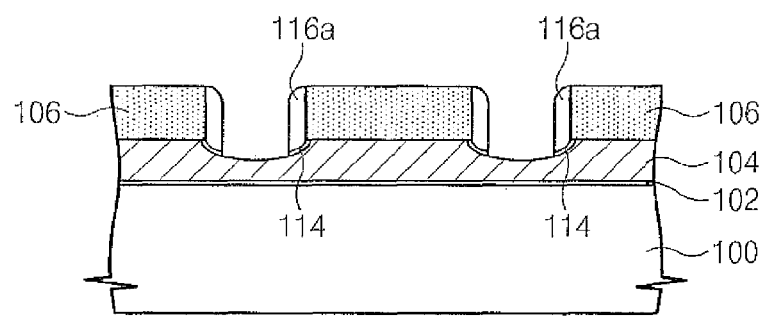
Figure 12C:
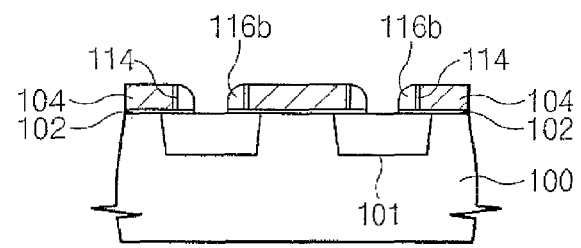

Referring to FIG. 12A, FIG. 12B, and FIG. 12C, the spacer insulation layer 116 is anisotropically etched to form a spacer insulation pattern 116a on a sidewall of the groove. An insulation pattern 116b may be formed on a device isolation layer where the floating gate conductive layer 104 is removed, covering the sidewall of the floating gate conductive layer 104. Not only the spacer insulation layer 116 but also the thermal oxide layer 114 on the floating gate conductive layer 104 is removed to expose a floating gate conductive layer 104 between opposite spacer insulation patterns 116.

Figure 13A:
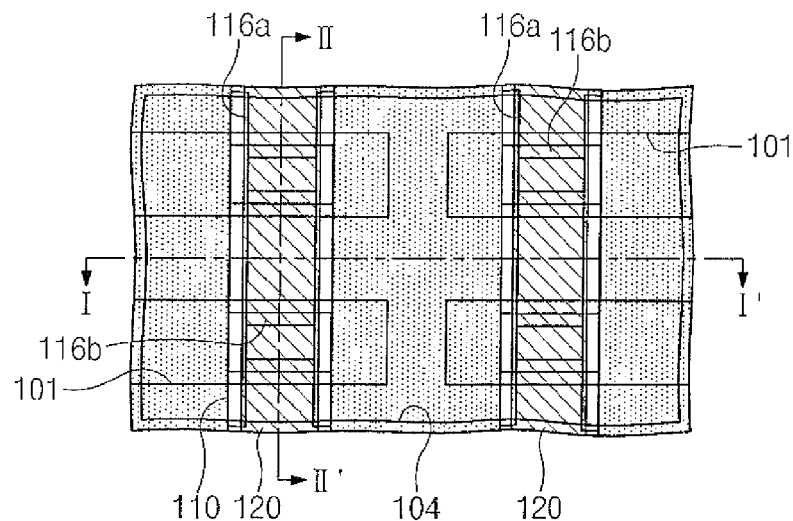
Figure 13B:
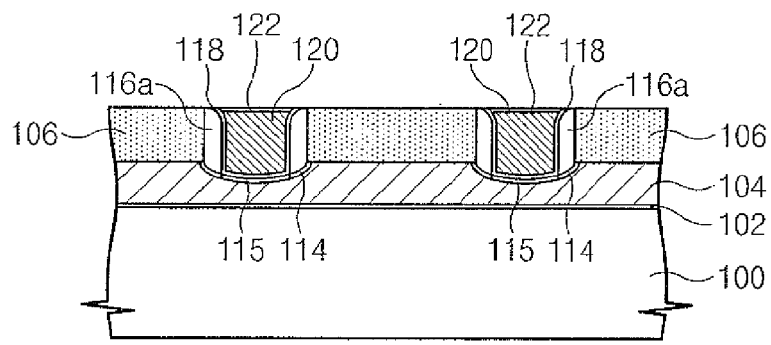
Figure 13C:
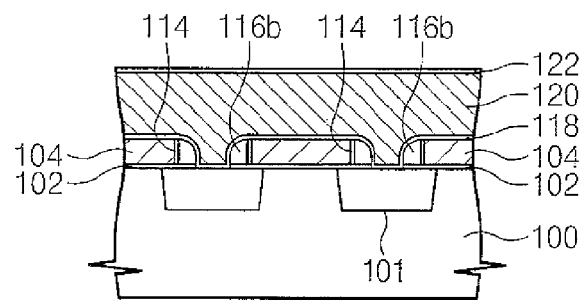

Referring to FIG. 13A, FIG. 13B, and FIG. 13C, the substrate is annealed to cure defects generated in an etch process of forming the spacer insulation pattern 116. As a result, the floating gate conductive layer 104 exposed between the spacer insulation patterns 116 may be thermally oxidized to form a thermal oxide layer 115.

A dielectric layer 118 is formed on an entire surface of the substrate. A top gate conductive layer 120 is formed on the dielectric layer 118 to fill an area between the spacer insulation patterns 116. The dielectric layer 118 may be made of metal oxide having a higher dielectric constant than silicon oxide, and the top gate conductive layer 120 may be made of doped polysilicon. The top gate conductive layer 120 and the dielectric layer 118 are planarized to expose the hard mask layer 106. The planarization of the top gate conductive layer 120 and the dielectric layer 118 may be done using CMP or an anisotropic etchback. As a result, a conformal dielectric layer 118 is interposed between the spacer insulation patterns 116 to fill the top gate conductive layer 120.

A capping layer 122 is formed on the top gate conductive layer 120. The capping layer 122 may be made of oxide having an etch selectivity with respect to the hard mask layer 106 and the floating gate conductive layer 104.

Figure 14A:
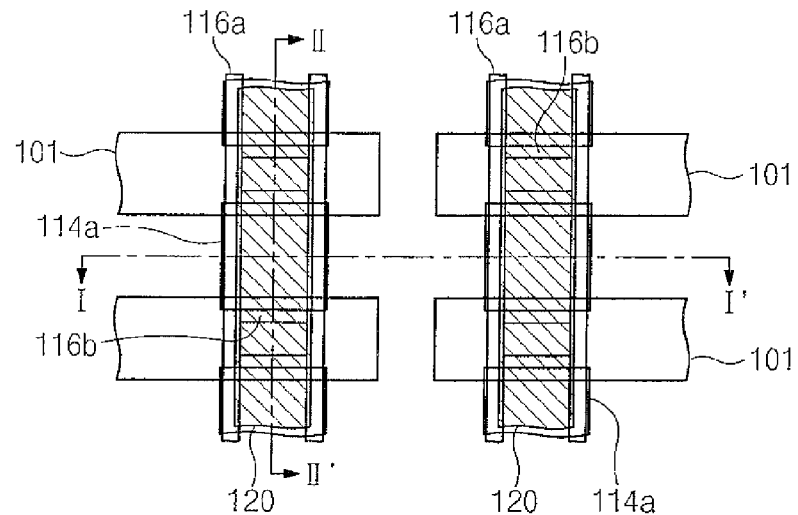
Figure 14B:
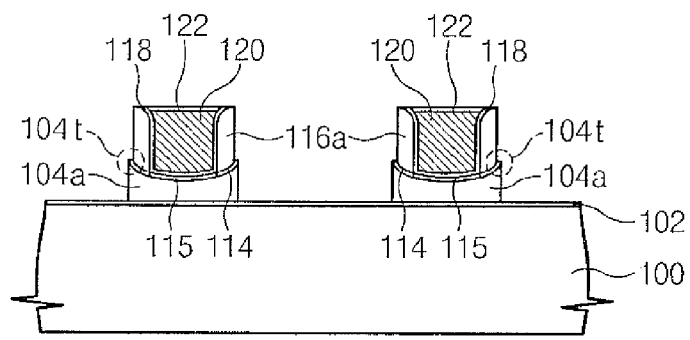
Figure 14C:
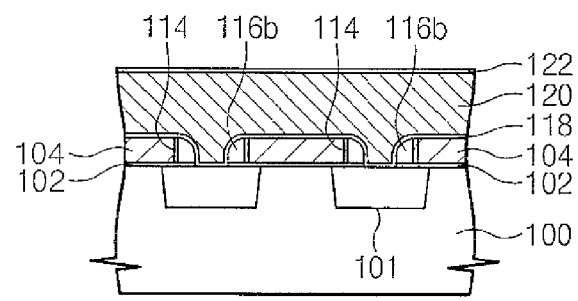

Referring to FIG. 14A, FIG. 14B, and FIG. 14C, the hard mask layer 106 is removed to expose the floating gate conductive layer 104 and sidewalls of and the spacer insulation patterns 116. The floating gate conductive layer 104 is patterned to be self-aligned with the sidewalls of the spacer insulation patterns 116, forming a floating gate 104a. The capping layer 122 on the top gate conductive layer 120 acts as an etch-stop layer while etching the hard mask layer 106 and the floating gate conductive layer 104. As a result, floating gates 104a are formed on the active region. The floating gates 104a have sidewalls self-aligned with sidewalls of the spacer insulation patterns 116. As previously described in FIG. 10A, FIG. 10B, and FIG. 10C, when a sacrificial oxide pattern is formed on a floating gate and etched to form a recess region, a tip 104t including a boundary portion of the sidewall of the floating gates 104a and the recess region 109 may be formed at the edge of the floating gate 104a.

Figure 15A:
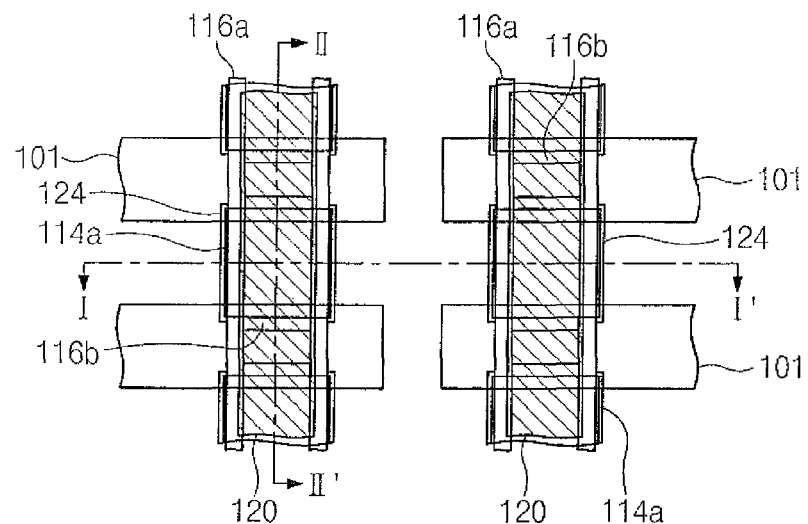
Figure 15B:
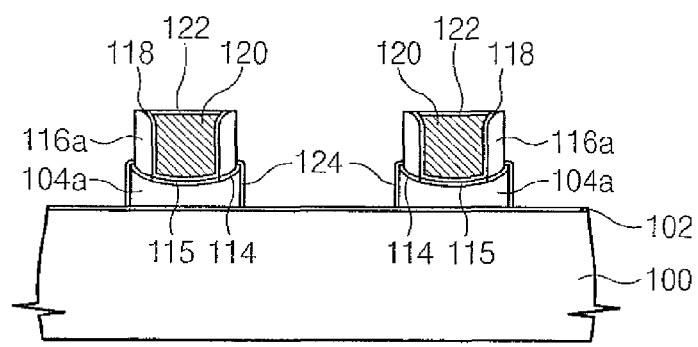
Figure 15C:
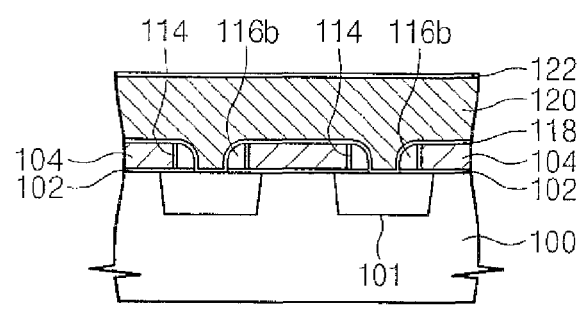

Referring to FIG. 15A, FIG. 15B, and FIG. 15C, an oxide layer 124 is formed on a sidewall of the floating gate 104a. The oxide layer 124 is connected to an oxide layer below the spacer insulation pattern 116 to be a tunnel oxide layer covering the tip 104t. The oxide layer 124 may be a thermal oxide layer where the sidewall of the floating gate 104a is oxidized. A gate insulation layer 102 remaining at opposite sides of the floating gate 104a may become thicker.

The oxide layer 124 may be formed after the sidewall of the spacer insulation patterns 116 is partially etched isotropically. Alternatively, after the sidewall of the floating gate 104a is thermally oxidized to cure etch damage, a thermal oxide layer is isotropically etched to form an additional thermal oxide layer or a CVD oxide layer. Thus, the oxide layer 124 is formed.

Figure 16A:
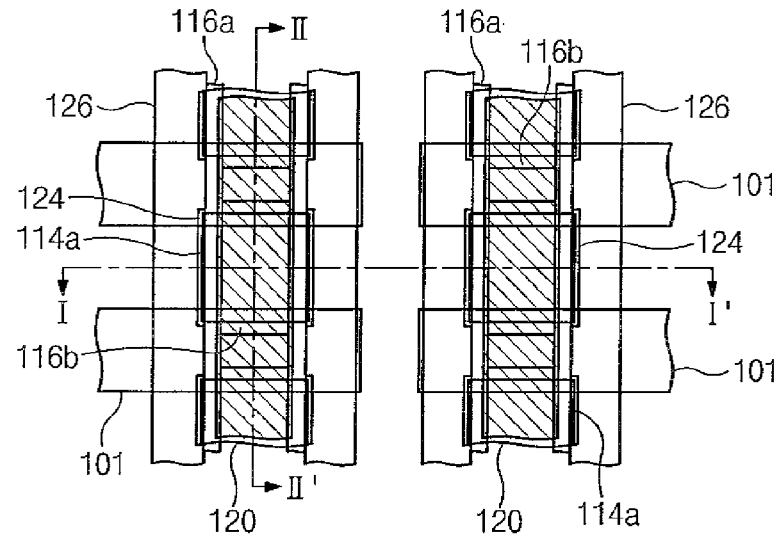
Figure 16B:
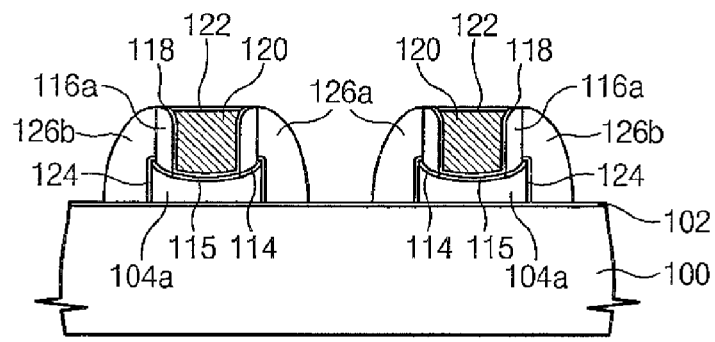
Figure 16C:
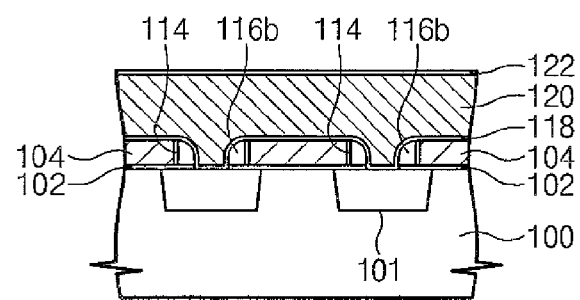

Referring to FIG. 16A, FIG. 16B, and FIG. 16C, a spacer conductive layer is formed on an entire surface of the substrate. The spacer conductive layer is anisotropically etched to form conductive patterns 126*a* and 126*b* on a sidewall including the spacer insulation pattern 116*a* and the floating gate 104*a*. The conductive patterns 126*a* and 126*b* may be symmetrical with each other.

Figure 17A:
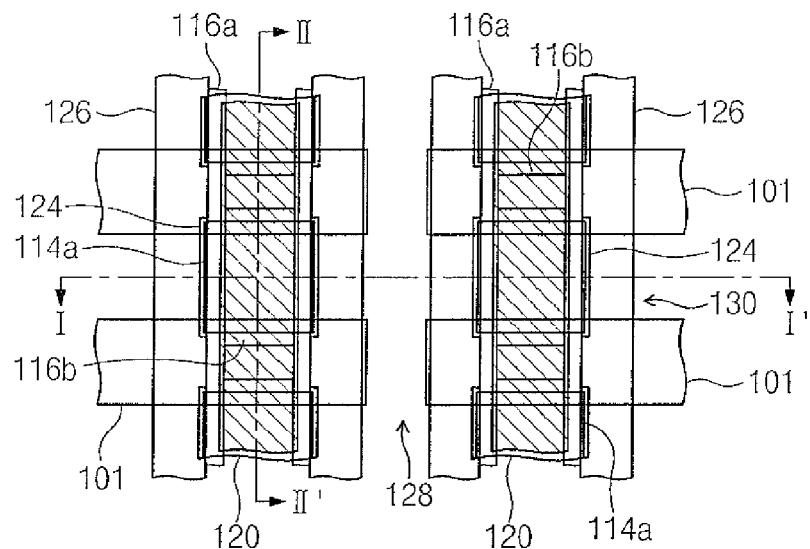
Figure 17B:
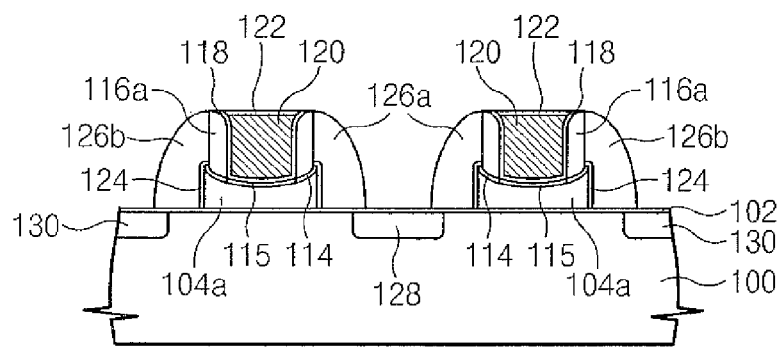
Figure 17C:
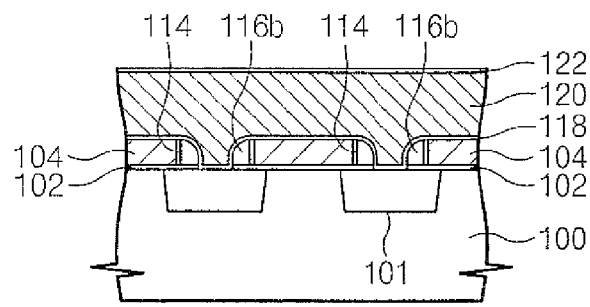

Referring to FIG. 17A, FIG. 17B, and FIG. 17C, using the structures on the substrate as an ion implanting mask, impurities are implanted into the active region. A source region 128 may be formed at an active region between first conductive patterns 126*a*, and a drain region 130 may be formed at an independent active region between second conductive patterns 126*b*.

As explained so far, a select gate electrode and a control gate electrode are formed on a floating gate and a voltage is applied to respective gate electrodes to perform program and erase operations. In the program operation, a program voltage is applied to the select gate electrode to inject charges from a channel. Therefore, a high voltage is not applied to a source region or a drain region. As a result, a write operation is performed more stably than a split-gate memory device in which a high voltage is applied to a source region to perform a write operation. Since the gate electrode and the control gate electrode are formed on the floating gate, the cell area is further reduced than an EEPROM in which a control gate electrode is formed to be spaced apart from a floating gate and a stacked select gate electrode.

Having described the exemplary embodiments of the present invention, it is further noted that is readily apparent to those reasonably skilled in the art that various modifications may be made without departing from the spirit and scope of the invention which is defined by the metes and bounds of the appended claims.

What is claimed is:

1. A method for operating a non-volatile memory device including a source region and a drain region defining a channel region, a gate insulation layer on the channel region, a floating gate on the gate insulation layer, a select gate electrode on the gate insulation layer and the floating gate, a control gate electrode on a sidewall of the floating gate and the gate insulation layer to be opposite to the select gate electrode, wherein the select gate electrode comprises a top select gate electrode disposed on the floating gate and a sidewall select gate electrode disposed on a sidewall of the floating gate and the gate insulation layer opposite to the control gate electrode, an intergate dielectric interposed between the select gate electrode and the floating gate, a tunnel insulation layer interposed between the control gate electrode and the floating gate, and a spacer insulation pattern interposed between the top select gate electrode and the sidewall select gate electrode and between the top select gate electrode and the control gate electrode, the method comprising:

a write step in which charges are injected to the floating gate through the gate insulation layer;

a read step in which fluctuation of a threshold voltage of the channel region below the floating gate, caused by charges stored in the floating gate is sensed; and an erase step in which tunneling of the charges stored in the floating gate is induced through the tunnel insulation layer.

2. The method of claim 1, wherein in the write step, a constant voltage (Vcc), a ground voltage (GND), a write voltage, and a turn-on voltage are applied to the source region, the drain region, the select gate electrode, and the control gate electrode, respectively to inject charges through the gate insulation layer.

3. The method of claim 2, wherein in the write step, the turn-on voltage applied to the control gate electrode is a voltage to form a channel at the channel region below the control gate electrode.

4. The method of claim 2, wherein in the write step, a write voltage is applied to enable hot carriers to be injected through the gate insulation layer between the floating gate and the channel region.

5. The method of claim 1, wherein in the read step, a ground voltage, a read voltage, a turn-on voltage, and a verify voltage are applied to the source region, the drain region, the select gate electrode, and the control gate electrode, respectively to sense data stored in the floating gate.

6. The method of claim 5, wherein in the read step, the turn-on voltage applied to the select gate electrode is a voltage to form a channel at the channel region below the select gate electrode.

7. The method of claim 5, wherein a verify voltage is applied to couple a voltage, which is higher than a write threshold voltage and lower than an erase threshold voltage, with the gate insulation layer between the floating gate and the channel region.

8. The method of claim 1, wherein in the erase step, a ground voltage is applied to the source region, the drain region, and the select gate electrode and an erase voltage is applied to the control gate electrode to induce charge tunneling occurring through the tunnel insulation layer.

9. The method of claim 8, wherein the erase voltage is applied to allow charge tunneling to occur through a tunnel insulation layer between the floating gate and the control gate electrode.

10. The method of claim 1, wherein the non-volatile memory device comprises a plurality of memory cells arranged in row and column directions, the drain regions of the memory cells are arranged in the row direction and connected to constitute a bitline;

the select gate electrodes of the memory cells are arranged in the column direction and connected to constitute a sensing line;

the control gate electrodes of the memory cells are arranged in the column direction and connected to constitute a wordline; and the source regions are arranged in the column direction and connected to constitute a common source line, wherein a constant voltage (Vcc), a ground voltage (GND), a write voltage, and a turn-on voltage are applied to a selected common source line, a selected bitline, a selected sensing line, and a selected wordline which are selected in the write step, respectively; and a ground voltage is applied to an unselected common source line, an unselected bitline, an unselected sensing line, and an unselected wordline.

11. The method of claim 10, wherein a ground voltage, a read voltage, a turn-on voltage, and a verify voltage are applied to a selected common source line, a selected bitline, a selected sensing line, and a selected wordline which are selected in the read step, respectively;

a ground voltage is applied to an unselected common source line, an unselected bitline, an unselected sensing line, and an unselected wordline.

12. The method of claim 10, wherein a ground voltage is applied to a selected common source line, a selected bitline, and a selected sensing line which are selected in the erase step, and an erase voltage is applied to a selected wordline; and a ground voltage is applied to an unselect unselected common source line, an unselected bitline, an unselected sensing line, and an unselected wordline.

13. The method of claim 12, wherein the sensing line is divided into predetermined memory cell units to allow a plurality of sensing lines to correspond to respective wordlines, in the erase step, a ground voltage is applied to a selected sensing line opposite to a selected wordline, and an erase inhibit voltage is applied to an unselected sensing line opposite to the selected wordline, whereby voltage levels of floating gates of memory cells rise to inhibit tunneling occurring through a tunnel insulation layer.

* * * * *